(12) United States Patent
Knollenberg et al.

(10) Patent No.: US 7,858,521 B2
(45) Date of Patent: Dec. 28, 2010

(54) FABRICATION FOR ELECTROPLATING THICK METAL PADS

(75) Inventors: Clifford F. Knollenberg, Mountain View, CA (US); Mark R. Teepe, Menlo Park, CA (US); Christopher L. Chua, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 947 days.

(21) Appl. No.: 11/614,267

(22) Filed: Dec. 21, 2006

(65) Prior Publication Data

US 2008/0153281 A1    Jun. 26, 2008

(51) Int. Cl.
*H01L 21/44* (2006.01)

(52) U.S. Cl. .................. 438/674; 438/612; 438/613; 438/614; 438/675; 438/678

(58) Field of Classification Search ......... 438/612–614, 438/674, 675, 678
See application file for complete search history.

(56) References Cited

U.S. PATENT DOCUMENTS 5,072,520 A * 12/1991 Nelson .................. 29/852
5,892,272 A * 4/1999 Lynch .................. 257/668
2005/0176234 A1* 8/2005 Shei et al. .................. 438/613

* cited by examiner

*Primary Examiner*—Kevin M Picardat
*Assistant Examiner*—Bac H Au
(74) *Attorney, Agent, or Firm*—Marger Johnson & McCollom, P.C.

(57) ABSTRACT

A method of electroplating includes forming a seed region to be electroplated on a first portion of a substrate, forming a ground plane on a second portion of a substrate, electrically isolating the ground plane from the seed region, electroplating the region, wherein electroplating includes causing the ground plane and the region to make electrical connection, and then removing the ground plane region on the second portion of the substrate, but not removing the electrical isolation. This creates a structure having a substrate, a passivation layer on the substrate, and at least one electroplated, metal region on the substrate such that there is contiguous contact between the metal region and the passivation layer. And, after an additional flip-chip assembly to a bond pad/heat sinking chip, results in a device having a bond pad chip having bond pads, solder beads formed on the bond pads, and a component connected to the bond pads by the solder beads. Wherein, the component has a substrate, a passivation layer on the substrate, and at least one electroplated, metal region on the substrate such that there is contiguous contact between the metal region and the passivation layer.

12 Claims, 4 Drawing Sheets

FABRICATION FOR ELECTROPLATING THICK METAL PADS

BACKGROUND

Packaging of ultraviolet (UV) transmitters, such as Light Emitting Diodes (LEDs), generally involves 'flip-chip' bonding the LED to another chip to allow light extraction through the underlying substrate. Typically, flip-chip bonding is one type of mounting used for semiconductor devices, such as IC chips, to mount chips together or in a package. In this process solder beads are deposited on one of the chip's electrical pads, and then the individual LED die, or ideally the entire wafer of LED die, is mounted upside down on the package, or receiving chip. This leaves the LED chip's electrical connections facing down onto the package, while the back side of the die faces up.

Issues arise in the packaging and mounting processes of LEDs with regard to properly heat sinking the LED region for heat management, as well as making isolated but robust connections to the p and n contacts of the LED. Depositing thick metal over the p and n contacts, on the order of micrometers (microns), and an electrical passivation layer between them helps alleviate both of these problems. The thick metal pad acts as a heat sink, while ensuring that the contacts to the isolated p and n regions make the necessary electrical connections. The electrical passivation layer is essential to preventing the two contacts from shorting together during the bonding process.

Electroplating generally forms the thick metal pads. During the typical electroplating process for the thick metal pads, extra effort ensures that the ground plane layer has electrical contact with the electroplating seed layer. The extra effort generally involves a photolithography step with an additional mask layer, over etching of a passivation layer, or a deliberate misalignment during a photolithography process.

Each extra step adds complexity and cost to the manufacturing process that in turn affects the cost of the resulting chip or chips. Removal of any of the processes within the manufacturing process would lower the complexity and decrease the cost of manufacturing the resulting packaged LEDs on the chips.

SUMMARY

Embodiments include a method of electroplating. The method includes forming a seed region to be electroplated on a first portion of a substrate, forming a ground plane on a second portion of a substrate, electrically isolating the ground plane from the region, and electroplating on the seed region, wherein electroplating includes causing the ground plane and the seed region to make electrical connection. The remaining ground plane regions are then removed isolating the electrical connects from one another.

Other embodiments include a structure having a substrate, a passivation layer on the substrate, and at least one electroplated, metal region on the substrate such that there is contiguous contact between the metal region and the passivation layer.

Other embodiments include a device having a bond pad chip having bond pads, solder beads formed on the bond pads, and a component connected to the bond pads by the solder beads. The component has a substrate, a passivation layer on the substrate, and at least one electroplated, metal region on the substrate such that there is contiguous contact between the metal region and the passivation layer.

BRIEF DESCRIPTION OF THE DRAWINGS

Embodiments of the invention may be best understood by reading the disclosure with reference to the drawings, wherein.

DETAILED DESCRIPTION OF THE EMBODIMENTS

Figure 1:
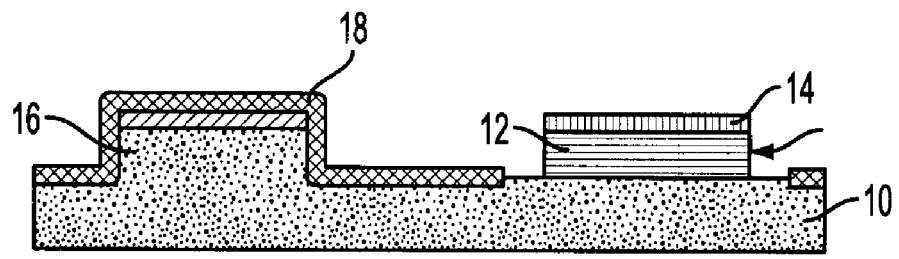
FIG. 1 shows a typical LED structure as an example of a structure suitable for electroplating at the beginning of the electroplating process.

FIG. 1 shows a structure suitable for electroplating. This particular structure is a light-emitting diode (LED), but any structure suitable for electroplating may undergo the processes described here. The example of an LED merely provides a basis for discussion, and no limitation to the particular structure is intended or should be inferred. The techniques disclosed here may also apply to many electronic, opto-electronic, microelectromechanical components that may benefit from electroplating such as improved structural stability, enhanced heat sinking, lower electrical resistance, added mass to the chip, etc.

In the following discussion, the manufacturing process employs several different processes and procedures for ease of discussion with the understanding that any process may be replaced with any other process of a similar nature. For example, the discussion below discloses wet etching with the understanding that it is an example of material removal process and any suitable material removal process may occur in place of wet etching.

FIG. 1 shows an LED that already has its active region 12 formed on the substrate 10. The substrate 10 may be sapphire or other transparent substance that allows transmission of light when the LEDs are flip-chip bonded, or mounted 'upside down.' The substrate 10 may have a mesa 16 to allow the n-contact and p-contact regions to allow electrically connections to occur on approximately the same plane during flip-chip bonding.

Initially, a series of aluminum-gallium-nitrogen (AlGaN) layers are epitaxially grown on a suitable substrate, typically sapphire, that comprises the LED active layers. The LED active region then receives a coating of p-contact metal, such as nickel/gold (Ni/Au) 14. This process may also use other materials. The process may consist of evaporating the p-contact metal onto the LED chip, and then performing photolithographic patterning to define the regions of the p-contact metal as an example of a patterning process. The unwanted portion of the p-contact metal may then be removed in a wet etch, or other removal process, and then the aluminum-gallium-nitrogen (AlGaN) is in turned etched using the same photolithographic patterning, by chemically assisted ion beam etching (CAIBE) for example.

The n-contact metal, layer 18, may then be evaporated or otherwise deposited, portions defined, such as by photolithography, and selected portions removed. The resulting structure may then undergo testing, prior to beginning the electroplating process. FIG. 1 shows this resulting structure. The electroplating process, as that term is used here, refers to the processing that occurs after the structure suitable for electroplating with a suitable seed layer exists. In this discussion, the remaining processes are part of the electroplating process.

Figure 2:
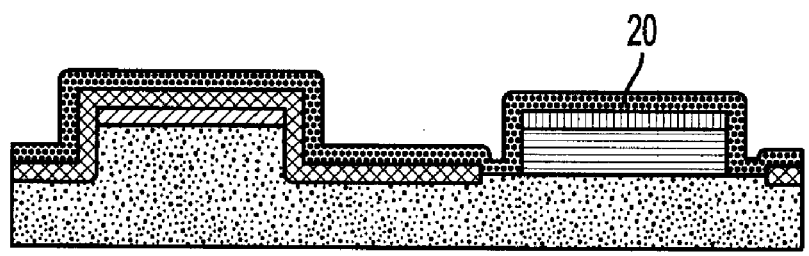
FIG. 2 shows an LED structure with a silicon nitride passivation layer.

In FIG. 2, an isolation layer 20 is deposited, such as silicon nitride (SiN). This isolation layer may also be referred to as a passivation layer. In one embodiment, the passivation material is etch-resistant, as in the case of SiN. Etch-resistant, as that term is used here, means a material that requires a relatively long time to etch compared to the ground plane material in the ground plane material etchant. Other materials include silicon dioxide ($SiO_2$).

Figure 3:
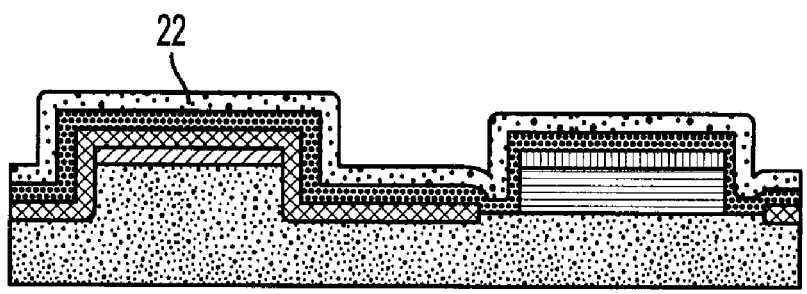
FIG. 3 shows a titanium ground plane on the passivation layer.

FIG. 3 shows the addition of a ground plane 22 used for passing electrical current during electroplating. In this example, a titanium ground plane is used. Alternative materials include titanium-tungsten (TiW) and tungsten (W). The surface is coated with photoresist and a single photolithographic step then defines the titanium and passivation layers to form the plating patterns. It should be noted, as will be discussed further, only one photolithographic process is necessary.

The process then etches the titanium and silicon nitride. This may be done in a single etch step that patterns both materials, or by using two different etches or removal processes that are selective to the two different materials. As mentioned before, the passivation layer is etch-resistant, meaning that it will etch, but not nearly as quickly as the ground plane in the preferred ground plane material etchant. For example, using a wet hydrogen-fluoride (HF) etch, the titanium etches in approximately 90 seconds, and the silicon nitride etches for 3 minutes after the titanium clears. Alternately, a wet HF solution could be used to etch the titanium and a dry plasma used to etch the SiN.

Figure 4:
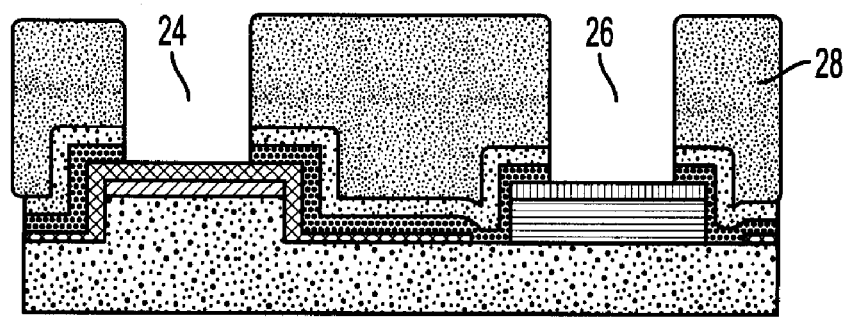
FIG. 4 shows an LED structure after a photolithographic patterning and etching process.

After etching, the structure has openings 24 and 26, as shown in FIG. 4, over the n-contact and p-contact metal, respectively. The photoresist 28 remaining from the photolithography step is left in place for the electroplating process. As mentioned previously, in current approaches to electroplating, a further masking and etching process, typically with photolithography, occurs to ensure connection between the ground plane and the electroplating seed layers of the n-contact and p-contact metals. In the embodiments disclosed here, however, those extra processes are eliminated.

Figure 5:
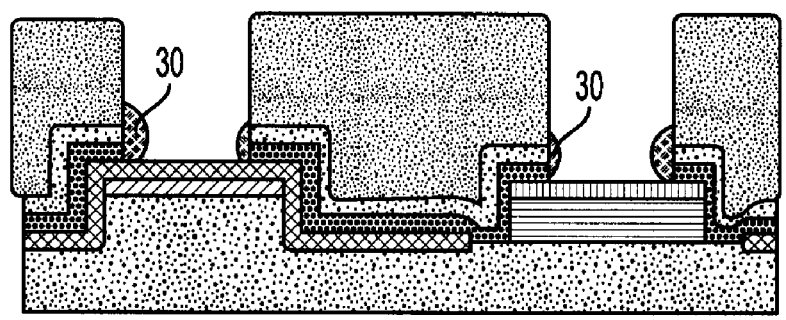
FIG. 5 shows an initial, lateral metal bead formation from a ground plane.

At the time the actual electroplating begins, when the ground plane receives the current while in the electroplating bath, the ground plane and the seed layers have no electrical connection. As can be seen in FIG. 4, the passivation layer separates the titanium layer from the seed layers. When the ground layer receives current in the electroplating bath, an initial metal bead forms at the accessible portions of the ground plane, as shown in FIG. 5.

The initial metal bead 30 begins to grow laterally from the portions of the ground plane to which the metal in the electroplating bath have access. The growth may begin in a nonplanar fashion, as shown in FIG. 5. Very soon after the formation of the initial, lateral bead, however, the bead itself causes an electrical short between the ground plane and the seed layer, in this example, titanium and gold respectively. Once shorted, the growth commences from the seed layer surface, as the seed layer begins to receive current.

Figure 6:
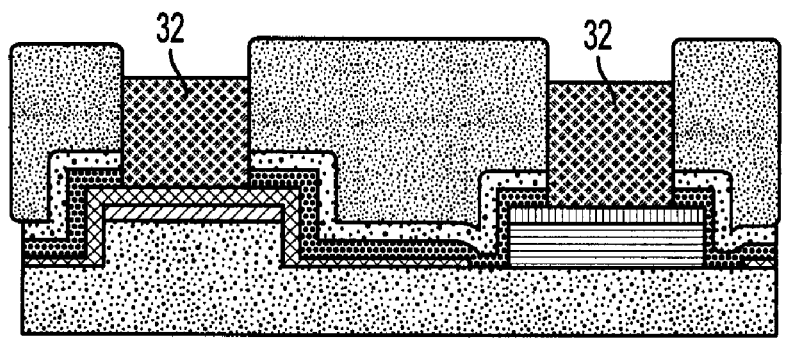
FIG. 6 shows an example of a structure at the end of an electroplating process.

FIG. 6 shows the resulting structure with thick metal pads 32 prior to photoresist removal. In one example, the metal pads form from a series of electroplating baths of copper, nickel and gold. Other types of metallization could also employ these techniques, such as gold based, indium based, or lead-tin based metallization.

Figure 7:
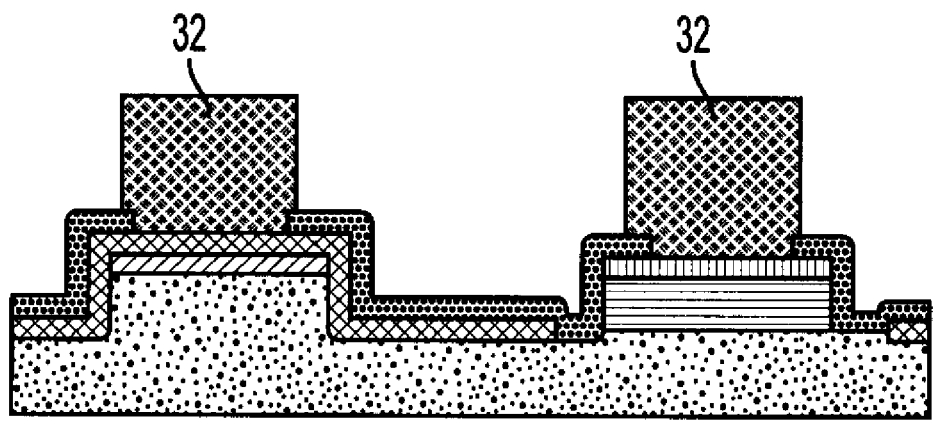
FIG. 7 shows an example of a structure after removal of photoresist and a ground plane.

FIG. 7 shows the structure after removal of the photoresist and the ground plane. Its is during ground plane removal process that the etch resistant nature of the passivation layer is critical. If the layer's ability to isolate electrical currents is ruined after the removal process, then unwanted electrical shorts may occur in the structure. Alternately, the ground plane may be reacted into an electrically isolating material that does not cause electrical shorting between the p and n contacts. For example by reacting titanium and oxygen to form titanium dioxide ($Ti+O_2 \rightarrow TiO_2$). Also, in the current implementations of electroplating, referred to above, where a connection exists between the seed layer and the ground plane, the final structure after ground plane removal would have a structural difference from the structure resulting from the processes disclosed here. In order for the connection to be made between the ground plane and the seed layers, the ground plane would coat the side walls of the passivation layer region. After removal of the ground plane, a small gap would exist between the passivation layer and the electroplated metal as a result of the removal of the ground plane material forming the electrical connection. As can be seen in FIG. 7, the passivation layer and the metal pads 32 have contiguous contact. This may have structural and electrical benefits for the structure.

Figure 8:
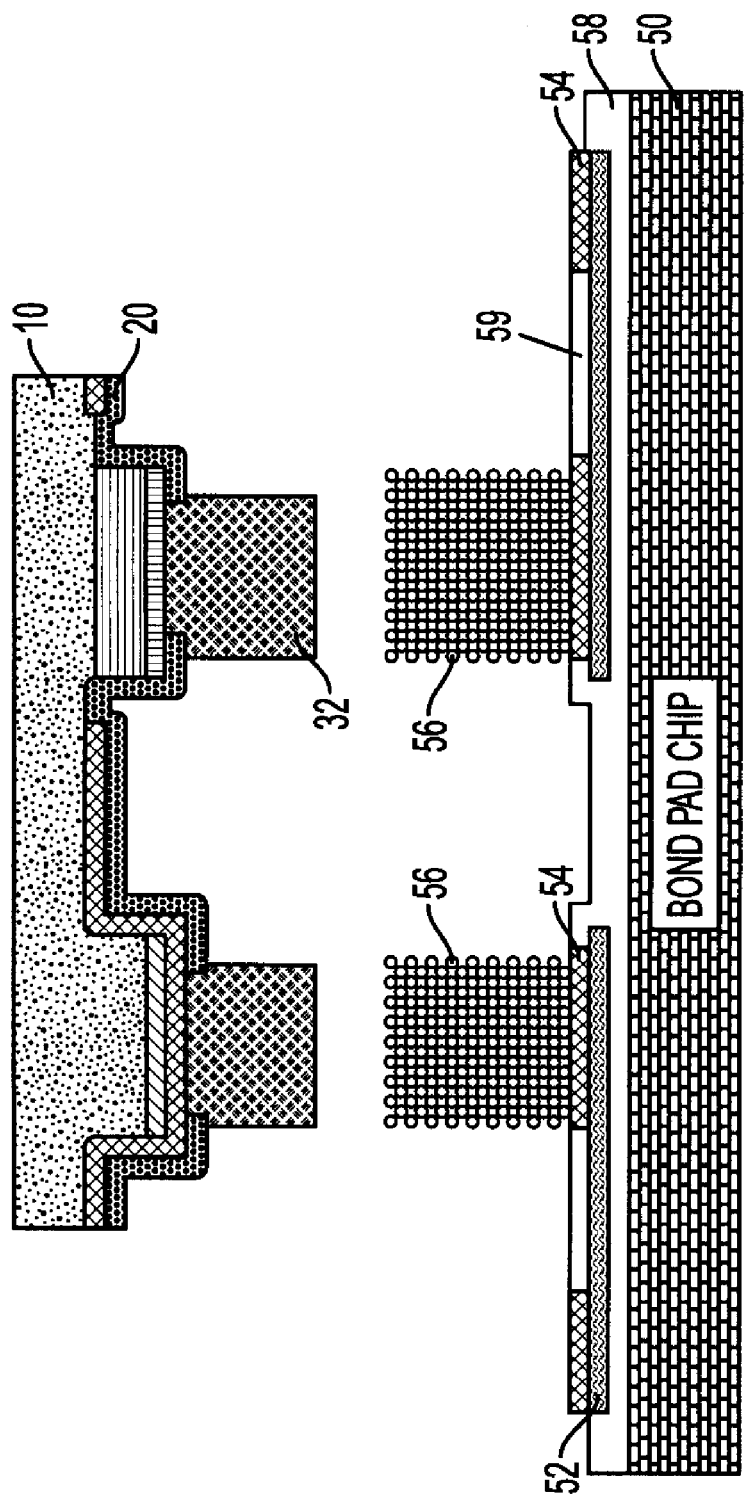
FIG. 8 shows an example of an electroplated structure being flip-chip bonded to a bond pad chip for packaging.

FIG. 8 shows an electroplated structure having thick metal pads being flip-chip bonded to a bond pad chip. The bond pad chip has a substrate 50, with a passivation layer 58 and 59. A wiring layer 52 makes contact with bond pads 54. Solder, or other material, such as an electrically conductive paste 56, forms bumps or beads on the bond pads 54.

To mount the electroplated structure, the substrate 10 is flipped over and soldered or otherwise mounted onto the bond pads 54 by the solder 56. The structure on substrate 10 still has its passivation layer 20. In the example of an LED, the substrate 10 may be transparent or otherwise allow the passage of light of at least the wavelength emitted by the LED to allow the 'upside down' LED to be usable.

In this manner, the above process provides a simplified method of electroplating thick metal pads onto structures that require electrical contact with other structures. While the examples shown here include LEDs and other devices suitable for flip-chip bonding, other devices and other mounting processes may be employed.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method of electroplating, comprising:
   forming a seed region to be electroplated on a first portion of a substrate;
   forming a ground plane on a second portion of a substrate such that the ground plane is electrically isolated from the seed region;
   electroplating the seed region, wherein electroplating includes causing the ground plane and the seed region to make electrical connection; and removing the ground plane from the second portion of the substrate by reacting the ground plane into an electrical passivation layer upon completion of the electroplating.

2. The method of claim 1, wherein forming a ground plane comprises depositing a passivation layer between the seed region and the ground plane to electrically isolate the ground plane from the region.

3. The method of claim 2, wherein depositing the passivation layer comprises depositing the passivation layer resistant to the ground plate material removal process.

4. The method of claim 2, wherein depositing the passivation layer further comprises depositing one of silicon nitride or silicon dioxide.

5. The method of claim 1, wherein forming the seed region to be electroplated comprises forming a layer of metal comprised of one of gold, titanium, molybdenum, nickel, niobium, or aluminum.

6. The method of claim 1, wherein forming the region to be electroplated comprises forming an n-contact region and a p-contact region for a light emitting diode.

7. The method of claim 1, wherein forming the ground plane comprises forming a ground plane over the first and second portions of the substrate and selectively removing the ground plane from the first portion.

8. The method of claim 1, wherein removing the ground plane from the second portion does not affect the electrical isolation characteristics of the passivation layer.

9. The method of claim 1, wherein forming the ground plane further comprises forming a layer of one of titanium, titanium-tungsten or tungsten.

10. The method of claim 1, wherein electroplating the region includes forming at least one initial metal bead.

11. The method of claim 10, wherein forming the initial metal bead causes the ground plane to short to a seed region to be electroplated, resulting in electroplating on that region.

12. The method of claim 1, wherein the method employs a single photolithographic process.

\* \* \* \* \*